United States Patent
Holliday, III et al.

(10) Patent No.: US 11,567,116 B2
(45) Date of Patent: Jan. 31, 2023

(54) SYSTEM AND METHOD FOR OPERATING A POWER GENERATING ASSET

(71) Applicant: General Electric Company, Schenectady, NY (US)

(72) Inventors: Cornelius Edward Holliday, III, Forest, VA (US); Talha Irfanul Haque, Roanoke, VA (US); David Scott Wilmer, Roanoke, VA (US)

(73) Assignee: General Electric Company, Schenectady, NY (US)

( * ) Notice: Subject to any disclaimer, the term of this patent is extended or adjusted under 35 U.S.C. 154(b) by 167 days.

(21) Appl. No.: 17/084,674

(22) Filed: Oct. 30, 2020

(65) Prior Publication Data

US 2022/0137118 A1    May 5, 2022

(51) Int. Cl.
   G01R 31/08    (2020.01)
   F03D 7/04     (2006.01)
   H02H 7/26     (2006.01)

(52) U.S. Cl.
   CPC ........... G01R 31/086 (2013.01); F03D 7/043 (2013.01); F03D 7/048 (2013.01); H02H 7/261 (2013.01)

(58) Field of Classification Search
   CPC ....... G01R 31/086; F03D 7/043; F03D 7/048; H02H 7/261
   See application file for complete search history.

(56) References Cited

U.S. PATENT DOCUMENTS

| 5,206,595 | A | 4/1993 | Wiggins et al. |
| 5,343,155 | A | 8/1994 | Kejariwal et al. |
| 7,881,888 | B2 | 2/2011 | Garcia |
| 8,558,551 | B2 | 10/2013 | Mynam et al. |
| 2010/0138182 | A1* | 6/2010 | Jammu .............. G05B 23/0229 290/44 |

FOREIGN PATENT DOCUMENTS

WO    WO 2019/212562 A1    11/2019

OTHER PUBLICATIONS

European Search Report for EP application No. 21204219.6, dated Mar. 3, 2022.

* cited by examiner

Primary Examiner — Viet P Nguyen
(74) Attorney, Agent, or Firm — Dority & Manning, P.A.

(57) ABSTRACT

A system and method are provided for operating a power generating asset. Accordingly, a controller detects a fault condition impacting the power generating asset. The controller then determines whether the fault condition is occurring in the power generating asset or is occurring in the power grid. When the fault condition is occurring in the power generating asset, a first response control scheme is implemented. However, when the fault condition is occurring in the power grid, a second response control scheme is implemented. The response control schemes include a first current threshold and a second current threshold respectively, with first current threshold being less than the second current threshold. Additionally, a control action is implemented in response to an approach of a current to the respective current threshold.

20 Claims, 5 Drawing Sheets

SYSTEM AND METHOD FOR OPERATING A POWER GENERATING ASSET

FIELD

The present disclosure relates in general to power generating assets, and more particularly to systems and methods for operating power generating assets during a fault condition.

BACKGROUND

As disclosed herein, power generating assets may take a variety of forms and may include power generating assets which rely on renewable and/or nonrenewable sources of energy. Those power generating assets which rely on renewable sources of energy may generally be considered one of the cleanest, most environmentally friendly energy sources presently available. For example, wind turbines have gained increased attention in this regard. A modern wind turbine typically includes a tower, a generator, a gearbox, a nacelle, and one or more rotor blades. The nacelle includes a rotor assembly coupled to the gearbox and to the generator. The rotor assembly and the gearbox are mounted on a bedplate support frame located within the nacelle. The rotor blades capture kinetic energy of wind using known airfoil principles. The rotor blades transmit the kinetic energy in the form of rotational energy so as to turn a shaft coupling the rotor blades to a gearbox, or if a gearbox is not used, directly to the generator. The generator then converts the mechanical energy to electrical energy and the electrical energy may be transmitted to a converter and/or a transformer housed within the tower and subsequently deployed to a utility grid. Modern wind power generation systems typically take the form of a wind farm having multiple wind turbine generators that are operable to supply power to a transmission system providing power to a power grid.

In order to supply power to the power grid, the power generating assets generally need to conform to certain grid requirements. For example, power generating assets may be required to offer fault-ride through (e.g. low-voltage ride through) capability. This requirement may mandate that a wind turbine stay connected to the power grid during one or more transient grid events, such as a grid fault. As used herein, the term "grid fault" or similar is intended to cover an abrupt or unanticipated change in the magnitude of a grid voltage for a certain time duration. For example, when a grid fault occurs, the voltage of the system can decrease by a significant portion for a short duration (e.g., typically less than 500 milliseconds). Grid faults may occur for variety of reasons, including but not limited to a phase conductor being connected to a ground (i.e. a ground fault), short-circuiting between phase conductors, lightning and/or windstorms, and/or accidental transmission line grounding.

In order to provide the required fault-ride through capability, overcurrent protective features may be configured to require a significant amount of overcurrent for a long duration before tripping. This may permit the power generating asset to continue providing power to the power grid throughout the fault. However, such overcurrent/duration configurations may also permit an undesirable amount of current to flow from the power grid to the components of the power generating asset when the fault occurs in the power generating asset, rather than the power grid. For example, should a component of the electrical system of the power generating system be unintentionally grounded, a quantity of power may flow from the power grid and into the power generating asset without tripping the overcurrent protective features. Accordingly, the components of the electrical system of the power generating asset may be designed to handle higher fault currents for longer than would be typically desirable when for a fault located within the power generating asset. This, in turn, may increase the cost and/or result in an undesirable degradation of the components of the electrical system.

Thus, the art is continuously seeking new and improved systems and methods that address the aforementioned issues. As such, the present disclosure is directed to systems and methods for controlling a power generating asset in response to a fault condition.

BRIEF DESCRIPTION

Aspects and advantages of the invention will be set forth in part in the following description, or may be obvious from the description, or may be learned through practice of the invention.

In one aspect, the present disclosure is directed to a method for operating a power generating asset connected to a power grid. The method may include detecting, via a controller, a fault condition impacting the power generating asset. Additionally, the method may include determining, via the controller, whether the fault condition is occurring in the power generating asset or is occurring in the power grid. The method may also include implementing a first response control scheme defining a first current threshold when the fault condition is occurring in the power generating asset, and a second response control scheme defining a second current threshold when the fault condition is occurring in the power grid. The first current threshold may be less than the second current threshold. Further, the method may include implementing a control action in response to an approach of a current to the first current threshold when the fault condition is occurring in the power generating asset and to the second current threshold when the fault is occurring in the power grid.

In an embodiment, the first response control scheme may include at least a first control parameter and a first protection parameter. Additionally, the second response control scheme may include at least a second control parameter and a second protection parameter.

In an additional embodiment, the first and second protection parameters may each comprise a timed overcurrent operating characteristic, an instantaneous-delayed overcurrent operating characteristic, an instantaneous-threshold overcurrent operating characteristic, a definite-time overcurrent operating characteristic, an inverse-time overcurrent operating characteristic, and/or a hybrid overcurrent operating characteristic.

In a further embodiment, detecting the fault condition may also include detecting, via the controller, a magnitude of the current exceeding a rated current of the power generating asset.

In yet a further embodiment, the current may include a grid current, a generator current, a line-converter current, an array current, an energy-storage-device discharge current, and/or a system-level current.

In an embodiment, determining whether the fault condition is occurring in the power generating asset or in the power grid may also include receiving, via the controller, an indication of at least a first electrical parameter monitored by an operating sensor. The method may also include calculating, via the controller, at least a second electrical parameter. Based, at least on the first and second electrical parameters, the method may include determining, via an analysis module of the controller, a fault location of the fault.

In an additional embodiment, the first electrical parameter may include a stator voltage, a stator current, a line voltage, and/or a line current. Additionally, the second electrical parameter may include calculated indications of a stator power, a stator volt-ampere reactive (VAR), a line power, a line VAR, and a grid-event-ride-through state.

In a further embodiment, determining the fault location of the fault may also include correlating, via the controller, the fault location to a component of an electrical system of the power generating asset.

In yet a further embodiment, the method may include implementing, via the controller, a component-response control scheme of a plurality of component-response control schemes of the first response control scheme which corresponds to the component of the electrical system correlating to the fault location.

In an embodiment, each component-response control scheme of the plurality of component-response control schemes may include a corresponding set of control parameters. Additionally, implementing the component-response control scheme may include modifying at least one control response of the power generating asset based on the corresponding control parameters.

In an additional embodiment, the method may include detecting, via the controller, a continued indication of the fault condition following the implementation of the control action. The method may also include tripping a protective feature of the power generating asset in response to the continued indication of the fault condition.

In a further embodiment, the method may include implementing, via the controller, a delay sequence between the implementation of the control action and the detection of the fault condition following the implementation of the control action.

In yet a further embodiment, the power generating asset may include a wind turbine, a solar power generating asset, a hydroelectric plant, and/or a hybrid power generating facility.

In another aspect, the present disclosure is directed to a system for operating a power generating asset connected to a power grid. The system may include a generator operably coupled to the power grid, at least one sensor operably coupled between the power grid and the generator, and a controller communicatively coupled to the sensor(s). The controller may include at least one processor configured to perform a plurality of operations. The plurality of operations may include any of the operations and/or features described herein.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure of the present invention, including the best mode thereof, directed to one of ordinary skill in the art, is set forth in the specification, which makes reference to the appended figures, in which.

Figure 1:
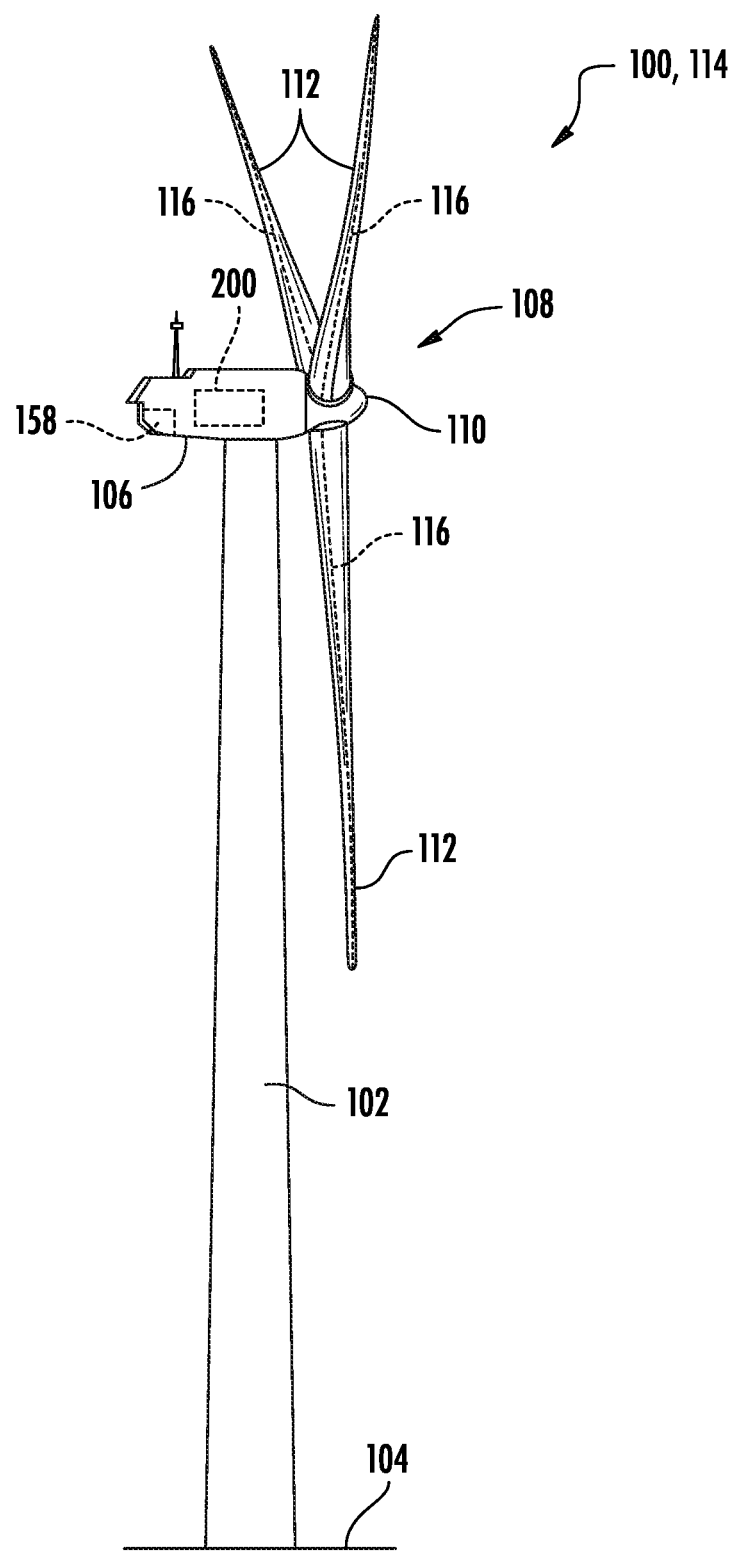
FIG. 1 illustrates a perspective view of one embodiment of a power generating asset configured as a wind turbine according to the present disclosure.

Repeat use of reference characters in the present specification and drawings is intended to represent the same or analogous features or elements of the present invention.

DETAILED DESCRIPTION

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

As used herein, the terms "first", "second", and "third" may be used interchangeably to distinguish one component from another and are not intended to signify location or importance of the individual components.

The terms "coupled," "fixed," "attached to," and the like refer to both direct coupling, fixing, or attaching, as well as indirect coupling, fixing, or attaching through one or more intermediate components or features, unless otherwise specified herein.

Approximating language, as used herein throughout the specification and claims, is applied to modify any quantitative representation that could permissibly vary without resulting in a change in the basic function to which it is related. Accordingly, a value modified by a term or terms, such as "about", "approximately", and "substantially", are not to be limited to the precise value specified. In at least some instances, the approximating language may correspond to the precision of an instrument for measuring the value, or the precision of the methods or machines for constructing or manufacturing the components and/or systems. For example, the approximating language may refer to being within a 10 percent margin.

Here and throughout the specification and claims, range limitations are combined and interchanged, such ranges are identified and include all the sub-ranges contained therein unless context or language indicates otherwise. For example, all ranges disclosed herein are inclusive of the endpoints, and the endpoints are independently combinable with each other.

Generally, the present disclosure is directed to systems and methods for operating a power generating asset during fault conditions. Specifically, the systems and methods disclosed herein may tailor the response control scheme implemented during a fault condition based on whether the fault is occurring in the power generating asset or in the power grid. When the fault is determined to be occurring in the power grid, the implemented control scheme may employ an overcurrent protective feature with a current threshold that requires a relatively high amount of overcurrent for a relatively long duration before tripping (e.g. opening). This may permit the generated current to flow safely from the power generating asset to the power grid, as may be required by grid regulations.

In contrast to the grid fault (e.g. an external fault), when the fault is determined to be occurring in the power generating asset (e.g. an internal fault), the implemented control scheme may employ an overcurrent protective feature with a current threshold that requires lower overcurrent for a shorter duration to trip than when the fault is occurring in the power grid. This approach may serve to protect the components of the power generating asset from an overcurrent transmitted to the power generating asset when a short-circuit is present in the power generating asset. In other words, should a short-circuit ground the power generating asset while the power generating asset is connected to the power grid, an electric current from the power grid may flow into the power generating asset in an effort to seek ground (e.g. a flow opposite of the normal flow of power from the power generating asset to the power grid). This flow of current from the power grid may overload the components of the power generating asset if the overcurrent protective features are configured based on a requirement to maintain the power flow from the power generating asset to the power grid in the event of a grid fault. Thus, the ability to trip quickly in the event of the internal short that prevents the flow of power from the power grid to the power generating asset may be desirable.

It should be appreciated that the utilization of the systems and methods described herein may permit the power generating asset to remain closed (e.g. not trip) when encountering a ride-through grid fault, yet trip quickly when an internal short is detected. This may, in turn, permit the circuit internals of the power generating asset (e.g. cables, busbars, contactors, and/or fuses) to be designed at a lower cost point due to the reduced overcurrent protection rating demands. Additionally, implementing different control schemes for the responses to internal versus external faults may permit the connection of the power generating assets to higher-voltage power grids (without necessitating a redesign of the components of the power generating asset), as the internal components of the power generating asset may be protected from the higher current from the higher-voltage power grid by the tailored control scheme.

Referring now to the drawings, FIG. 1 illustrates a perspective view of one embodiment of a power generating asset 100 according to the present disclosure. As shown, the power generating asset 100 may be configured as a wind turbine 114. In an additional embodiment, the power generating asset 100 may, for example, be configured as a solar power generating asset, a hydroelectric plant, a fossil fuel generator, and/or a hybrid power generating asset.

When configured as a wind turbine 114, the power generating asset 100 may generally include a tower 102 extending from a support surface 104, a nacelle 106, mounted on the tower 102, and a rotor 108 coupled to the nacelle 106. The rotor 108 includes a rotatable hub 110 and at least one rotor blade 112 coupled to and extending outwardly from the hub 110. For example, in the illustrated embodiment, the rotor 108 includes three rotor blades 112. However, in an alternative embodiment, the rotor 108 may include more or less than three rotor blades 112. Each rotor blade 112 may be spaced about the hub 110 to facilitate rotating the rotor 108 to enable kinetic energy to be transferred from the wind into usable mechanical energy, and subsequently, electrical energy. For instance, the hub 110 may be rotatably coupled to an electric generator 118 (FIG. 2) of an electrical system 400 (FIG. 2) positioned within the nacelle 106 to permit electrical energy to be produced.

The wind turbine 114 may also include a controller 200 centralized within the nacelle 106. However, in other embodiments, the controller 200 may be located within any other component of the wind turbine 114 or at a location outside the wind turbine. Further, the controller 200 may be communicatively coupled to any number of the components of the wind turbine 114 in order to control the components. As such, the controller 200 may include a computer or other suitable processing unit. Thus, in several embodiments, the controller 200 may include suitable computer-readable instructions that, when implemented, configure the controller 200 to perform various different functions, such as receiving, transmitting and/or executing wind turbine control signals.

Figure 2:
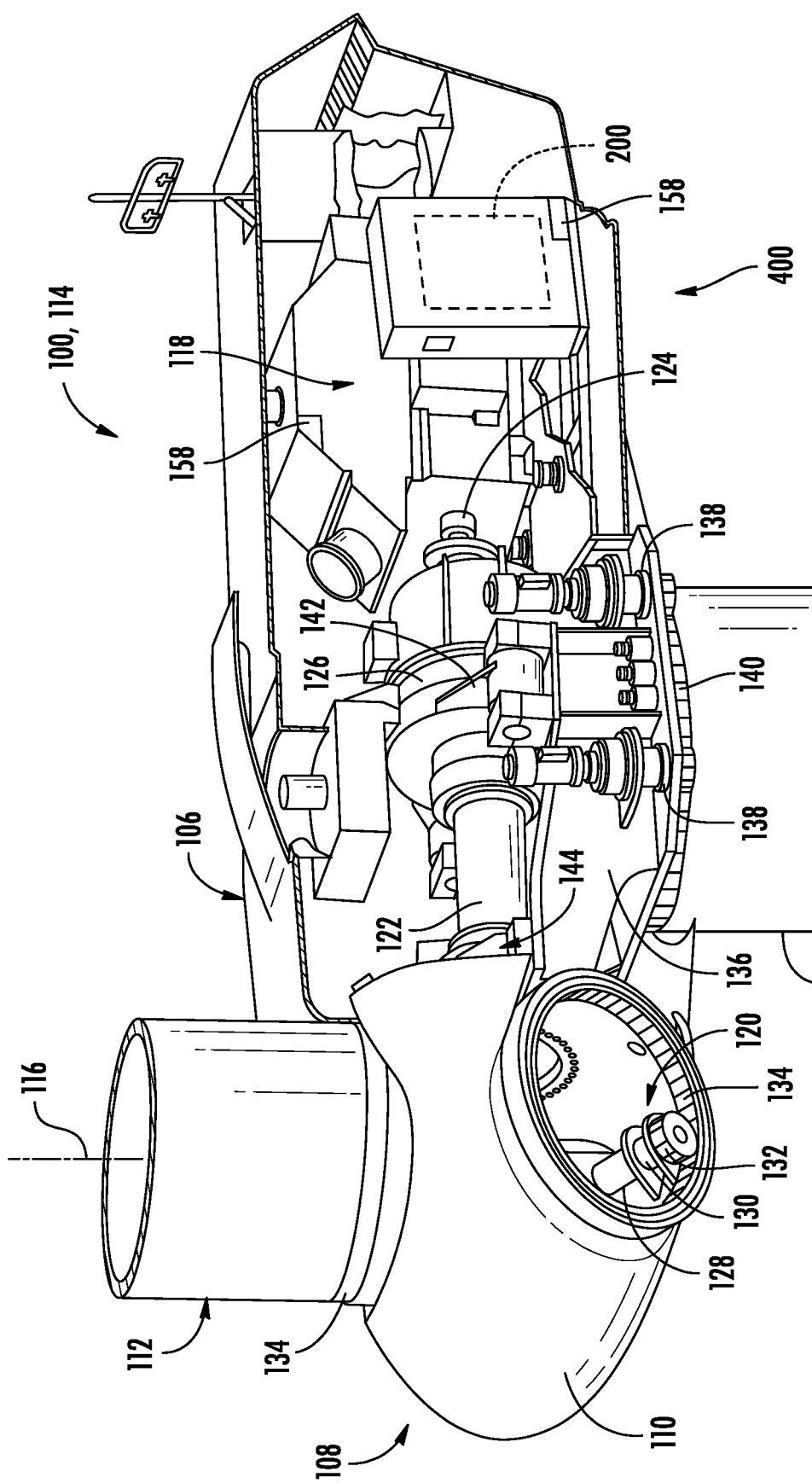
FIG. 2 illustrates a perspective, internal view of one embodiment of a nacelle of the wind turbine according to the present disclosure.
Figure 3:
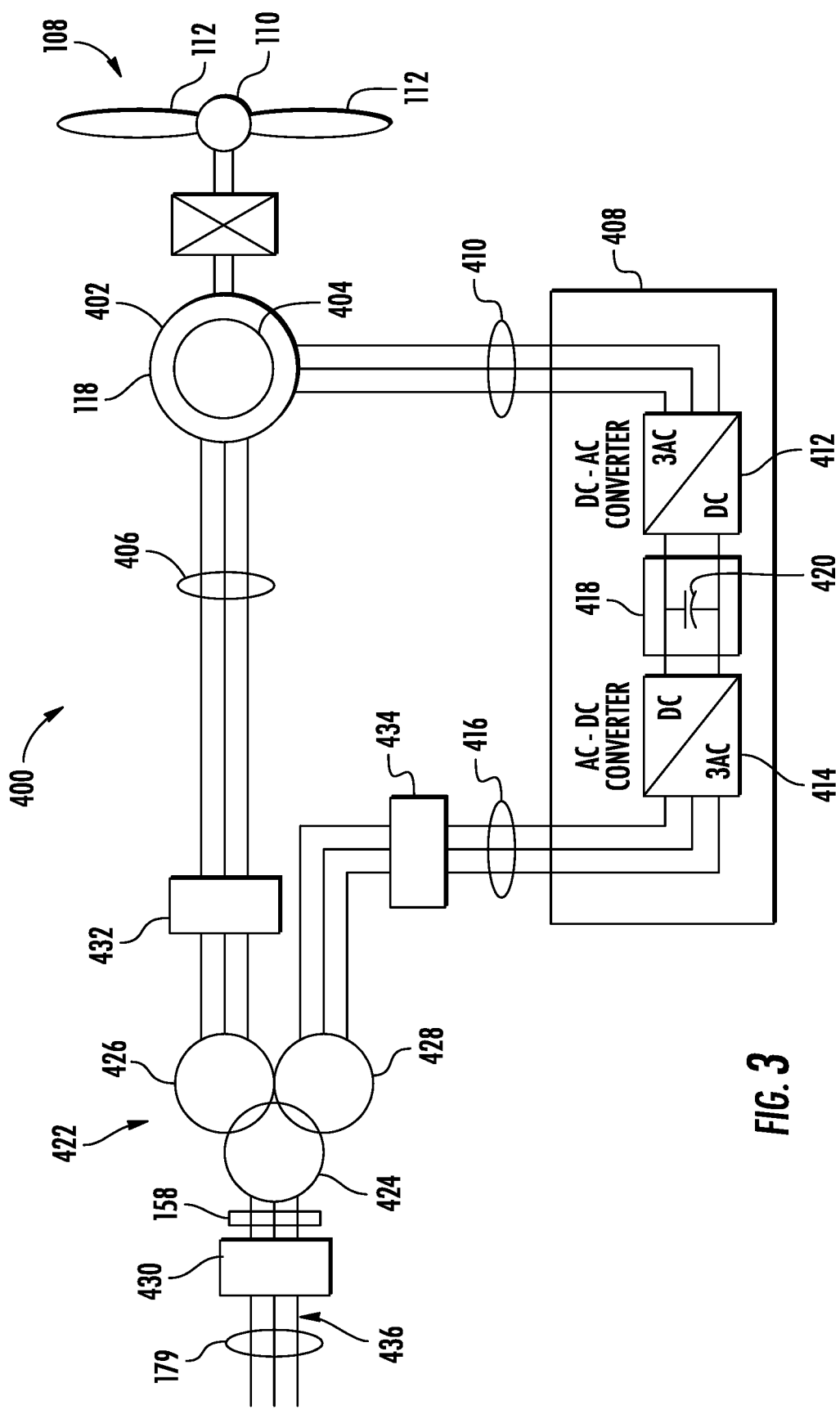
FIG. 3 illustrates a schematic diagram of one embodiment of an electrical system for use with the power generating asset according to the present disclosure.

Referring now to FIGS. 2 and 3, a simplified, internal view of one embodiment of the nacelle 106 and an exemplary electrical system 400 of the power generating asset 100 are illustrated. As shown, the generator 118 may be coupled to the rotor 108 for producing electrical power from the rotational energy generated by the rotor 108. For example, as shown in the illustrated embodiment, the rotor 108 may include a rotor shaft 122 coupled to the hub 110 for rotation therewith. The rotor shaft 122 may be rotatably supported by a main bearing 144. The rotor shaft 122 may, in turn, be rotatably coupled to a high-speed shaft 124 of the generator 118 through an optional gearbox 126 connected to a bedplate support frame 136 by one or more torque arms 142. As is generally understood, the rotor shaft 122 may provide a low-speed, high-torque input to the gearbox 126 in response to rotation of the rotor blades 112 and the hub 110. The gearbox 126 may then be configured with a plurality of gears to convert the low-speed, high-torque input to a high-speed, low-torque output to drive the high-speed shaft 124 and, thus, the generator 118. In an embodiment, the gearbox 126 may be configured with multiple gear ratios so as to produce varying rotational speeds of the high-speed shaft for a given low-speed input, or vice versa.

Each rotor blade 112 may also include a pitch control mechanism 120 configured to rotate the rotor blade 112 about its pitch axis 116. Each pitch control mechanism 120 may include a pitch drive motor 128 (e.g., any suitable electric, hydraulic, or pneumatic motor), a pitch drive gearbox 130, and a pitch drive pinion 132. In such embodiments, the pitch drive motor 128 may be coupled to the pitch drive gearbox 130 so that the pitch drive motor 128 imparts mechanical force to the pitch drive gearbox 130. Similarly, the pitch drive gearbox 130 may be coupled to the pitch drive pinion 132 for rotation therewith. The pitch drive pinion 132 may, in turn, be in rotational engagement with a pitch bearing 134 coupled between the hub 110 and a corresponding rotor blade 112 such that rotation of the pitch drive pinion 132 causes rotation of the pitch bearing 134. Thus, in such embodiments, rotation of the pitch drive motor 128 drives the pitch drive gearbox 130 and the pitch drive pinion 132, thereby rotating the pitch bearing 134 and the rotor blade(s) 112 about the pitch axis 116. Similarly, the wind turbine 114 may include one or more yaw drive mechanisms 138 communicatively coupled to the controller 200, with each yaw drive mechanism(s) 138 being configured to change the angle of the nacelle 106 relative to the wind (e.g., by engaging a yaw bearing 140 of the wind turbine 114).

Referring particularly to FIG. 2, in an embodiment, the power generating asset 100 may include at least one operational sensor 158. The operational sensor(s) 158 may be configured to detect a performance of the power generating asset 100, e.g. in response to the environmental condition. In an embodiment, the operational sensor(s) 158 may be configured to monitor a plurality of electrical conditions, such as slip, stator voltage and current, rotor voltage and current, line-side voltage and current and/or any other electrical condition of the power generating asset and/or the power grid.

In an embodiment, the operational sensor(s) 158 may be configured as a grid sensor configured to monitor at least one parameter of the power of the power grid 179 and/or a power output of the power generating asset 100 delivered to the power grid 179. For example, the operational sensor(s) 158 may be configured to continuously monitor the voltage of the power grid 179 as seen by the power generating asset 100 and vice versa. Accordingly, the operational sensor(s) 158 may, in an embodiment, be an ammeter, a voltmeter, an ohmmeter, and/or any other suitable sensor for monitoring the power of the power grid 179 and/or the power output of the power generating asset 100. In other words, the operational sensor(s) 158 may be configured to monitor the magnitude of the power flowing from the power generating asset 100 and into the power grid 179 under normal and/or grid-fault conditions, and the power flowing from the power grid 179 into the power generating asset 100 in response to a fault within the power generating asset 100.

It should also be appreciated that, as used herein, the term "monitor" and variations thereof indicates that the various sensors of the power generating asset 100 may be configured to provide a direct measurement of the parameters being monitored or an indirect measurement of such parameters. Thus, the sensors described herein may, for example, be used to generate signals relating to the parameter being monitored, which can then be utilized by the controller 200 to determine a condition or response of the power generating asset 100.

Referring particularly to FIG. 3, in an embodiment, the electrical system 400 may include various components for converting the kinetic energy of the rotor 108 into an electrical output in an acceptable form to a connected power grid 179. For example, in an embodiment, the generator 118 may be a doubly-fed induction generator (DFIG) having a stator 402 and a generator rotor 404. The generator 118 may be coupled to a stator bus 406 and a power converter 408 via a rotor bus 410. In such a configuration, the stator bus 406 may provide an output multiphase power (e.g. three-phase power) from a stator of the generator 118, and the rotor bus 410 may provide an output multiphase power (e.g. three-phase power) of the generator rotor 404 of the generator 118. Additionally, the generator 118 may be coupled via the rotor bus 410 to a rotor side converter 412. The rotor side converter 412 may be coupled to a line-side converter 414 which, in turn, may be coupled to a line-side bus 416.

In an embodiment, the rotor side converter 412 and the line-side converter 414 may be configured for normal operating mode in a three-phase, pulse width modulation (PWM) arrangement using insulated gate bipolar transistors (IGBTs) as switching devices. Other suitable switching devices may be used, such as insulated gate commuted thyristors, MOS-FETs, bipolar transistors, silicone controlled rectifier's, and/or other suitable switching devices. The rotor side converter 412 and the line-side converter 414 may be coupled via a DC link 418 across a DC link capacitor 420.

In an embodiment, the power converter 408 may be coupled to the controller 200 configured as a converter controller 202 to control the operation of the power converter 408. For example, the converter controller 202 may send control commands to the rotor side converter 412 and the line-side converter 414 to control the modulation of switching elements used in the power converter 408 to establish a desired generator torque setpoint and/or power output.

Figure 4:
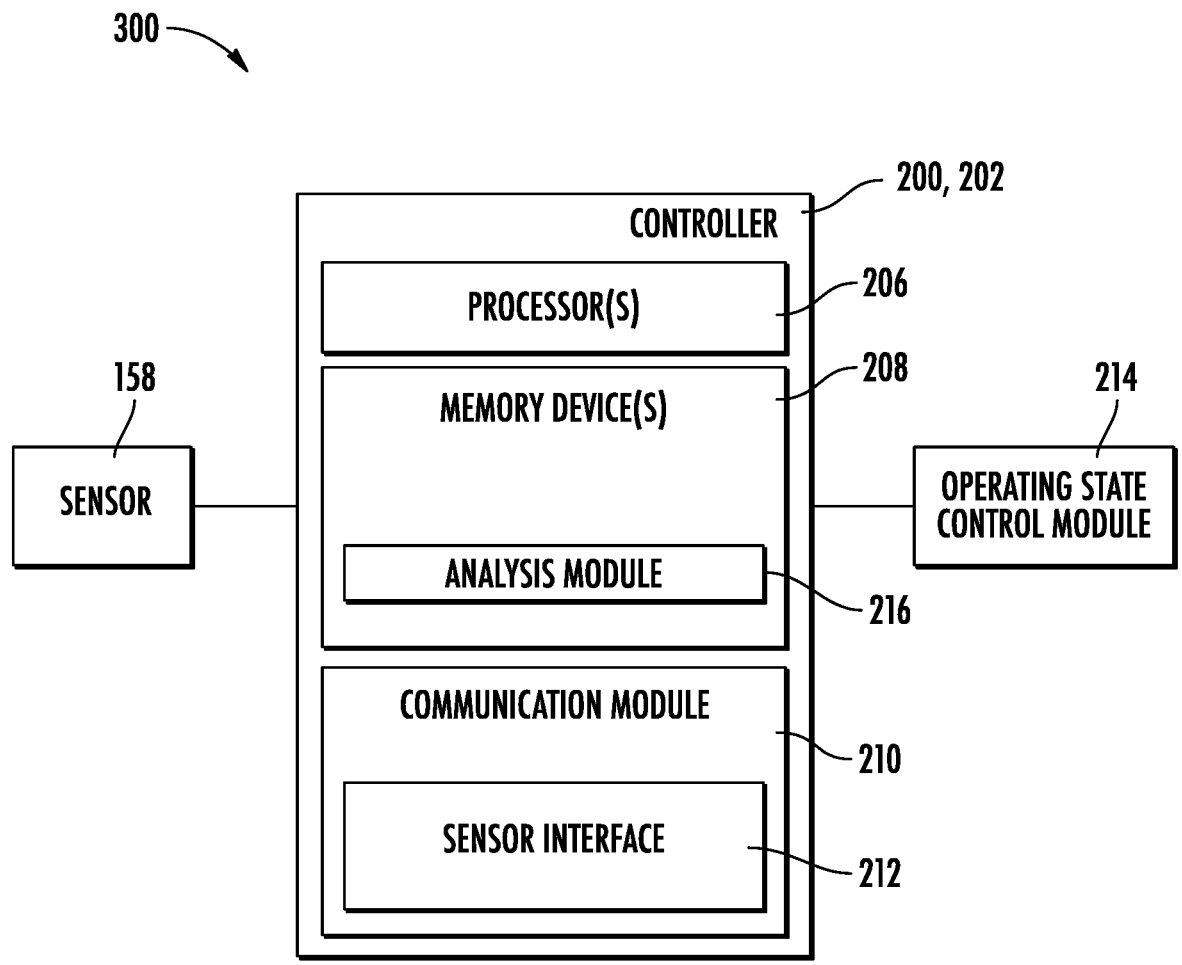
FIG. 4 illustrates a block diagram of one embodiment of a controller for use with the power generating asset according to the present disclosure.

As further depicted in FIG. 4, the electrical system 400 may, in an embodiment, include a transformer 422 coupling the power generating asset of 100 to the power grid 179 via a point of interconnect (POI) 436. The transformer 422 may, in an embodiment, be a 3-winding transformer which includes a high voltage (e.g. greater than 12 KVAC) primary winding 424. The high voltage primary winding 424 may be coupled to the power grid 179. The transformer 422 may also include a medium voltage (e.g. 6 KVAC) secondary winding 426 coupled to the stator bus 406 and a low voltage (e.g. 575 VAC, 690 VAC, etc.) auxiliary winding 428 coupled to the line bus 416. It should be appreciated that the transformer 422 can be a three-winding transformer as depicted, or alternatively, may be a two-winding transformer having only a primary winding 424 and a secondary winding 426; may be a four-winding transformer having a primary winding 424, a secondary winding 426, and auxiliary winding 428, and an additional auxiliary winding; or may have any other suitable number of windings.

In an embodiment, the electrical system 400 may include various protective features 330 (FIG. 5) (e.g. circuit breakers, fuses, contactors, and other devices) to control and/or protect the various components of the electrical system 400. For example, the electrical system 400 may, in an embodiment, include a grid circuit breaker 430, a stator bus circuit breaker 432, and/or a line bus circuit breaker 434. The circuit breaker(s) 430, 432, 434 of the electrical system 400 may connect or disconnect corresponding components of the electrical system 400 when a condition of the electrical system 400 approaches a threshold (e.g. a current threshold and/or an operational threshold) of the electrical system 400.

Figure 5:
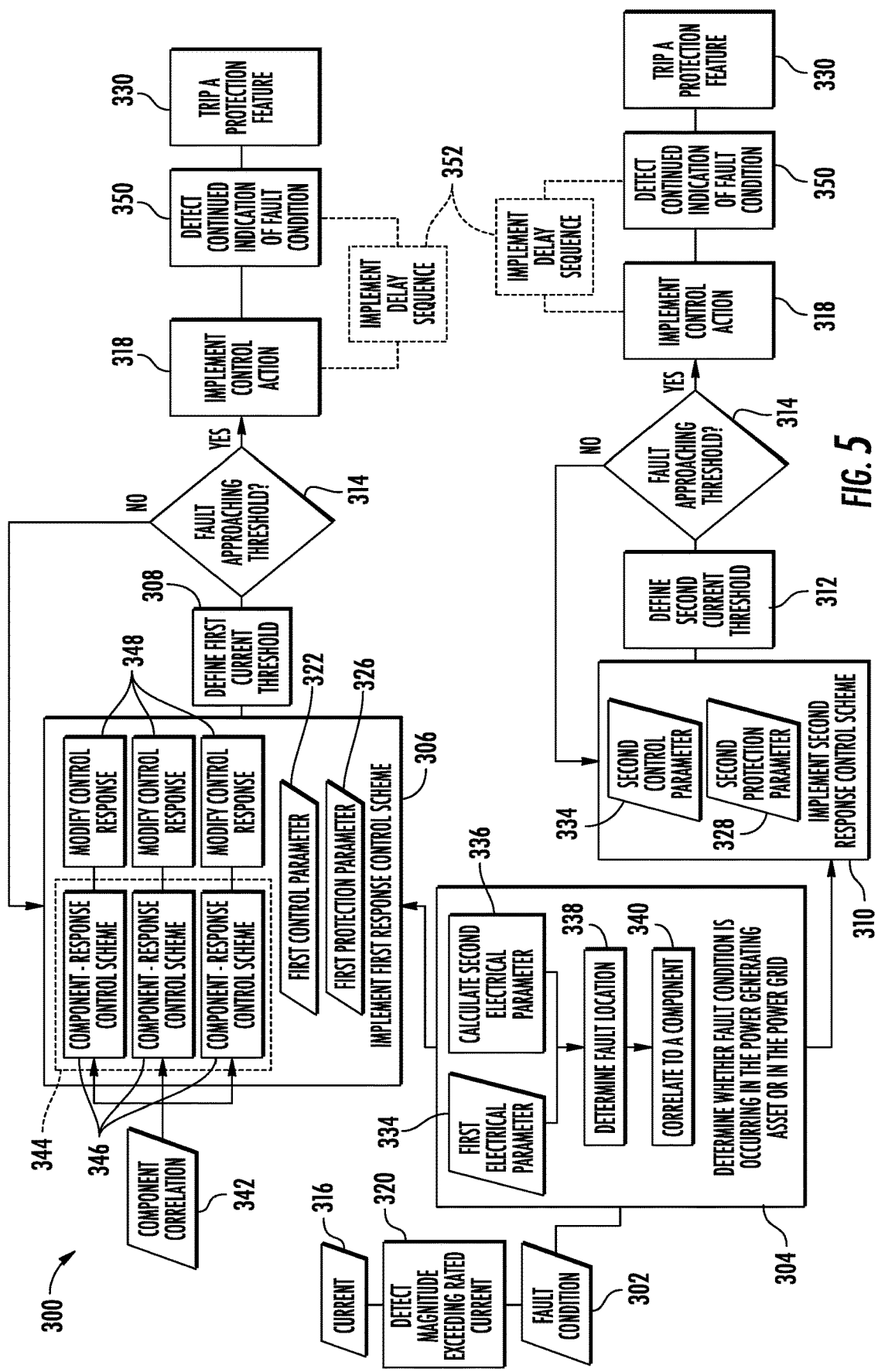
FIG. 5 illustrates a flow diagram of one embodiment of a control logic of a system for operating the power generating asset according to the present disclosure.

Referring to FIGS. 4 and 5, multiple embodiments of a system 300 for controlling the power generating asset 100 according to the present disclosure are presented. As shown particularly in FIG. 4, a schematic diagram of one embodiment of suitable components that may be included within the system 300 is illustrated. For example, as shown, the system 300 may include the controller 200 communicatively coupled to the operational sensor(s) 158. Further, as shown, the controller 200 includes one or more processor(s) 206 and associated memory device(s) 208 configured to perform a variety of computer-implemented functions (e.g., performing the methods, steps, calculations and the like and storing relevant data as disclosed herein). Additionally, the controller 200, may also include a communications module 210 to facilitate communications between the controller 200, and the various components of the power generating asset 100. Further, the communications module 210 may include a sensor interface 212 (e.g., one or more analog-to-digital converters) to permit signals transmitted from the sensor(s) 158 to be converted into signals that can be understood and processed by the processors 206. It should be appreciated that the sensor(s) 158 may be communicatively coupled to the communications module 210 using any suitable means. For example, the sensor(s) 158 may be coupled to the sensor interface 212 via a wired connection. However, in other embodiments, the sensor(s) 158 may be coupled to the sensor interface 212 via a wireless connection, such as by using any suitable wireless communications protocol known in the art. Additionally, the communications module 210 may also be operably coupled to an operating state control module 214 configured to change at least one power generating asset operating state.

As used herein, the term "processor" refers not only to integrated circuits referred to in the art as being included in a computer, but also refers to a controller, a microcontroller, a microcomputer, a programmable logic controller (PLC), an application specific integrated circuit, and other programmable circuits. Additionally, the memory device(s) 208 may generally comprise memory element(s) including, but not limited to, computer readable medium (e.g., random access memory (RAM)), computer readable non-volatile medium (e.g., a flash memory), a floppy disk, a compact disc-read only memory (CD-ROM), a magneto-optical disk (MOD), a digital versatile disc (DVD) and/or other suitable memory elements. Such memory device(s) 208 may generally be configured to store suitable computer-readable instructions that, when implemented by the processor(s) 206, configure the controller 200 to perform various functions including, but not limited to, determining whether the fault condition is occurring in the power generating asset 100 and the power grid 179 and implementing a tailored response control scheme based on the determination as described herein, as well as various other suitable computer-implemented functions.

Referring particularly to FIG. 5, in an embodiment, the controller 200 of the system 300 may detect a fault condition 302 impacting the power generating asset 100. As depicted at 304, the controller 200 may be configured to determine whether the fault condition 302 is occurring in the power generating asset 100 or is occurring in the power grid 179. In an embodiment wherein the controller 200 determines that the fault condition 302 is occurring in the power generating asset 100, the system 300 may implement a first response control scheme 306 (e.g. response protocol). The first response control scheme 306 may define a first current threshold 308. Additionally, in an embodiment wherein the controller 200 determines that the fault condition 302 is occurring in the power grid 179, the system 300 may implement a second response control scheme 310. The second response control scheme 310 may define a second current threshold 312. In an embodiment, the first current threshold 308 may be less than the second current threshold 312. In other words, the first current threshold 308 may facilitate the opening (e.g. tripping) of a protective feature 330 of the power generating asset 100 at a lower overcurrent magnitude than may be required when the fault is occurring in the power grid 179. As depicted at 314, the controller 200 may be configured to detect an approach of a current 316 to the first current threshold 308 when implementing the first response control scheme 306, and to detect an approach of the current 316 to the second current threshold 312 when implementing the second response control scheme 310. When the controller 200 detects the approach of the current 316 to the respective current threshold 308, 312, the controller 200 may implement a control action 318.

In an embodiment, the fault condition 302 may indicate an abnormal flow of the current 316. The fault condition 302 may include a deviation in the flow of the current 316 whereby the current 316 bypasses a nominal load path (e.g. a short circuit). For example, the fault condition 302 may be a ground fault wherein an unintended connection between a conductor and ground may be established. In other words, the fault condition 302 may be a physical condition that causes the performance of a circuit element to deviate from a nominal performance. This may, for example, include physical short-circuits, open circuits, component failures, and/or overloads.

In an embodiment, the fault condition 302 may exist in either the power grid 179 (e.g. an external fault) or in the power generating asset 100 (e.g. an internal fault). In an embodiment wherein the fault condition 302 is present in the power grid 179, the power generated by the power generating asset 100 may continue to flow in the same direction as is seen during normal operations of the power generating asset (e.g., from the power generating asset 100 to the power grid 179). In an embodiment, the fault condition 302 may, for example, correspond to a zero-voltage ride through (ZVRT) event, a low-voltage ride through (LVRT) event and/or a high-voltage ride through (HVRT) event wherein a rapid change in the voltage of the power grid 179, or the effects thereof, is detected, such as by the operational sensor(s) 158. In such an embodiment, the operational sensor(s) 158 may be operationally coupled to the POI 436 and the data received by the controller 200 may indicate a rapid change in the voltage of the power grid 179.

In an embodiment wherein the fault condition 302 may exist in the power generating asset 100, the fault condition 302 may be indicative of a condition within the power generating asset 100 which may permit a magnitude of power to flow from the power grid 179 into the electrical system 400. This flow may be in excess of a nominal current drawn from the power grid 179 during normal operations of the power generating asset 100 (e.g. a portion of the grid current required for operation of the DFIG generator 118). In such an embodiment, the current from the power grid 179 may far exceed the capacities of the various components of the electrical system 400. It should be appreciated that, as used herein, the fault condition 302 occurring within the power generating asset 100 may include faults in any component of the electrical system 400, including all electrical components from the POI 436 to the generator 118 (e.g. lines, contactors, buses, filters, breakers, etc.) as may be required to connect the power generating asset 100 to the power grid 179.

As depicted at 320, detecting the fault condition 302 may include detecting a magnitude of the current 316 exceeding a rated current (e.g. a nominal current rating, a design current rating, or a nameplate current rating) for the power generating asset 100. In such an embodiment, the current 316 may be detected by the operational sensor(s) 158. The current 316 may include a grid current, a generator current, a line-converter current, an array current, an energy-storage-device discharge current, and/or a system-level current.

In an embodiment, the first response control scheme 306 may include at least a first control parameter 322. Similarly, in an embodiment, the second response control scheme 310 may include at least a second control parameter 324. The first and second control parameters 322, 324 may, in an embodiment, be a plurality of control gains utilized by the controller 200 to determine a desired operating point for a component of the power generating asset 100.

In an additional embodiment, the first response control scheme 306 may include at least a first protection parameter 326. Similarly, in an embodiment, the second response control scheme 310 may include at least a second protection parameter 328. The first and second protection parameters 326, 328 may include various thresholds and/or time delays for the various protective features 330 of the electrical system 400. Accordingly, in an embodiment, the first and second protection parameters 326, 328 may each include a timed overcurrent operating characteristic, an instantaneous-delayed overcurrent operating characteristic, an instantaneous-threshold overcurrent operating characteristic, a definite-time overcurrent operating characteristic, an inverse-time overcurrent operating characteristic, and/or a hybrid overcurrent operating characteristic of the protective features 330. It should be appreciated that the protection parameters 326, 328 may describe the response characteristics of the various protective features 330 to an overcurrent condition. For example, a protective feature 330 having an instantaneous-threshold overcurrent operating characteristic, may trip based solely on the magnitude of the overcurrent. However, a protective feature 330 having a time-based overcurrent operating characteristic may trip based on a combination of overcurrent magnitude and overcurrent duration.

In order to implement the appropriate response to the fault condition 302, it may be desirable to determine whether the fault is an internal fault or an external fault and thus determine the flow direction of the current 316. To determine whether the fault condition 302 is occurring in the power generating asset 100 or in the power grid 179, the controller 200 may, in an embodiment, receive an indication of at least a first electrical parameter 334. In an embodiment, the first electrical parameter 334 may be monitored by the operational sensor(s) 158. The controller 200 may also, in an embodiment, calculate at least a second electrical parameter 336.

In an embodiment, the first electrical parameter 334 may be a generator voltage and current (e.g. stator voltage and a stator current), a line voltage, and/or a line current. In an additional embodiment, the second electrical parameter 336 may include calculated indications of a generator power (e.g. stator power), a generator volt-ampere reactive (VAR) (e.g. stator VAR), a line power, a line VAR, and/or a grid-event-ride-through state.

Utilizing at least the first and second electrical parameters 334, 336, the controller 200 may, in an embodiment, employ an analysis module 216 to determine a fault location 338 of the fault condition 302. In an embodiment, the analysis module 216 may utilize at least the first and second electrical parameter 334, 336 as inputs to an algorithm whose output is the determination of the fault location 338.

Accordingly, the algorithm may reflect a dependency relationship between at least the first and second electrical parameters 334, 336 and at least one potential fault location 338. In an additional embodiment, a plurality of possible first and second electrical parameter 334, 336 values may be correlated to a plurality of potential fault locations 338 in a lookup table and/or a graphical representation. It should be appreciated that, with regard to a fault condition 302 occurring within the power grid 179, the fault location 338 may, in an embodiment, refer to the determination that the fault condition 302 is occurring within the power grid 179 generally rather than to a specific location (e.g. a geographical location, node, and/or element) of the power grid 179.

In an embodiment, the controller 200 may be configured as a converter controller 202. The converter controller 202 may have higher fidelity performance data related to the electrical system 400 than may be available to other controllers, such as a turbine controller or a farm controller. For example, in an embodiment, the converter controller 202 may have a sampling frequency which is at least an order of magnitude greater than the sampling frequency of a controller 200 configured as a turbine controller. In an embodiment, the converter controller 202 may have a sampling frequency of at least one sample every 200 microseconds. Accordingly, in an embodiment, the converter controller 202 may receive/calculate the first and second electrical parameters 334, 336 at least once every 200 microseconds and determine the fault location 338 at the same frequency. Accordingly, the converter controller 202 may have a significant capacity to determine whether the fault condition is occurring in the power generating asset 100 or in the power grid 179, as depicted at 304.

As depicted at 340, in an embodiment, the controller 200 may utilize the fault location determination 338 from the analysis module 216 to correlate the fault location 338 to a specific component of the electrical system 400 of the power generating asset 100, thereby generating a component correlation 342.

In an embodiment, the first response control scheme 306 may include a plurality of component-response control schemes 344, which may be considered to be subroutines, schemes, and/or protocols of the first response control scheme 306. Each component-response control scheme 346 of the plurality of component-response control schemes 344 may correspond to the component of the electrical system 400 indicated by the component correlation 342. Accordingly, in an embodiment, the controller 200 may implement the component-response control scheme 346 which may generate a tailored response based on the specific component of the power generating asset 100 identified as the fault location 338.

In an embodiment, each of the component-response control schemes 346 may include a corresponding set of control parameters (e.g. control gains). The set of control parameters may be configured to tailor the control commands of the controller 200 in order to address the fault condition 302, as may be indicated by the identified fault location 338. Accordingly, as depicted at 348, implementing the component-response control scheme 346 may, in an embodiment, include modifying at least one control response of the power generating asset 100 based on the corresponding control parameters. For example, in an embodiment, a fault condition 302 occurring in one component of the power generating asset 100 may necessitate an immediate tripping of the protective feature(s) 330, while a fault condition 302 occurring in an additional component may necessitate a change in operating state of a component (e.g. a contactor and/or a breaker) so as to shunt the overcurrent 316 to a desirable location (e.g. close a contactor in order to ground a portion of the electrical system 400, such as the POI 436). Similarly, a fault condition 302 occurring in yet another component may necessitate a temporary de-rating of the power generating asset 100 and the initiation of a cooling protocol in order to compensate for temperature increase resulting from the overcurrent 316.

In an embodiment, the system 300 may implement the control action 318 as determined by the first or second response control schemes 306, 310. The control action 318 may, in an embodiment, include modifying an operating state, via the operating state control module 214, of a component of the power generating asset 100. In an embodiment, the modification of the operating state may include the establishment of the operating characteristics of the protective features 330. In an additional embodiment, modification of the operating state may include temporarily de-rating the power generating asset 100. Additionally, in an embodiment, the control action 318 may include limiting an operation of at least one component of the power generating asset. For example, the control action 318 may limit a pitching of a rotor blade 112 and/or a yawing of the nacelle 106 of the wind turbine 114. Accordingly, it should be appreciated that the control action 318 as described herein may further include any suitable command or constraint by the controller 200.

In an additional embodiment, the implementation of the control action 318 may also include generating an alarm. The generation of the alarm may facilitate the scheduling of a maintenance event in order to address a root cause of the fault condition 302 based on the fault location 338. Accordingly, the alarm may include an auditory signal, a visual signal, an alert, a notification, a system input, and/or any other system which may identify the fault location 338 to an operator.

As depicted at 350 of FIG. 5, in an embodiment, the controller 200 may detect a continued indication of the fault condition 302 following the implementation of the control action 318. For example, in an embodiment, the control action 318 may prove inadequate to clear the fault condition 302. In such an embodiment, the continued indication of the fault condition 302 may result in the tripping of the protective feature(s) 330 of the power generating asset 100. It should be appreciated that the tripping of the protective feature(s) 330 may result in the disconnecting of the power generating asset 100 from the power grid 179.

As the tripping of the protective feature(s) 330 may result in the disconnecting the power generating asset 100 from the power grid 179, it may be desirable to implement a delay sequence 352. The delay sequence 352 may be implemented between the implementation of the control action 318 and the detection of the continued indication of the fault condition, as indicated at 350. The employment of the delay sequence 352 may permit the detection of an impact of the control action 318 on the fault condition 302 prior to the opening of the protective feature(s) 330.

Furthermore, the skilled artisan will recognize the interchangeability of various features from different embodiments. Similarly, the various method steps and features described, as well as other known equivalents for each such methods and feature, can be mixed and matched by one of ordinary skill in this art to construct additional systems and techniques in accordance with principles of this disclosure. Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

Further aspects of the invention are provided by the subject matter of the following clauses:

Clause 1. A method for operating a power generating asset connected to a power grid, the method comprising: detecting, via a controller, a fault condition impacting the power generating asset; determining, via the controller, whether the fault condition is occurring in the power generating asset or in the power grid; implementing a first response control scheme defining a first current threshold when the fault condition is occurring in the power generating asset, and a second response control scheme defining a second current threshold when the fault condition is occurring in the power grid, wherein the first current threshold is less than the second current threshold; and implementing a control action in response to an approach of a current to the first current threshold when the fault condition is occurring in the power generating asset and to the second current threshold when the fault condition is occurring in the power grid.

Clause 2. The method of clause 1, wherein the first response control scheme further comprises at least a first control parameter and a first protection parameter, and wherein the second response control scheme further comprises at least a second control parameter and a second protection parameter.

Clause 3. The method of any preceding clause, wherein the first and second protection parameters each comprise at least one of a timed overcurrent operating characteristic, an instantaneous-delayed overcurrent operating characteristic, an instantaneous-threshold overcurrent operating characteristic, a definite-time overcurrent operating characteristic, an inverse-time overcurrent operating characteristic, and a hybrid overcurrent operating characteristic.

Clause 4. The method of any preceding clause, wherein detecting the fault condition further comprises: detecting, via the controller, a magnitude of the current exceeding a rated current of the power generating asset.

Clause 5. The method of any preceding clause, wherein the current comprises at least one of a grid current, a generator current, a line-converter current, an array current, an energy-storage-device discharge current, and a system-level current.

Clause 6. The method of any preceding clause, wherein determining whether the fault condition is occurring in the power generating asset or in the power grid further comprises: receiving, via the controller, an indication of at least a first electrical parameter monitored by an operational sensor; calculating, via the controller, at least a second electrical parameter; and based at least on the first and second electrical parameters, determining, via an analysis module of the controller, a fault location of the fault.

Clause 7. The method of any preceding clause, wherein the first electrical parameter comprises at least one of a stator voltage, a stator current, a line voltage, and a line current, and wherein the second electrical parameter comprises at least one of calculated indications of a stator power, a stator volt-ampere reactive (VAR), a line power, a line VAR, and a grid-event-ride-through state.

Clause 8. The method of any preceding clause, wherein determining the fault location of the fault further comprises: correlating, via the controller, the fault location to a component of an electrical system of the power generating asset.

Clause 9. The method of any preceding clause, further comprising: implementing, via the controller, a component-response control scheme of a plurality of component-response control schemes of the first response control scheme which corresponds to the component of the electrical system correlating to the fault location.

Clause 10. The method of any preceding clause, wherein each component-response control scheme of the plurality of component-response control schemes comprises a corresponding set of control parameters, and wherein implementing the component-response control scheme comprises:

modifying at least one control response of the power generating asset based on the corresponding control parameters.

Clause 11. The method of any preceding clause, further comprising: detecting, via the controller, a continued indication of the fault condition following the implementation of the control action; and tripping a protective feature of the power generating asset.

Clause 12. The method of any preceding clause, further comprising: implementing, via the controller, a delay sequence between the implementation of the control action and the detection of the fault condition following the implementation of the control action.

Clause 13. The method of any preceding clause, wherein the power generating asset comprises one of a wind turbine, a solar power generating asset, a hydroelectric plant, and a hybrid power generating facility.

Clause 14. A system for operating a power generating asset connected to a power grid, the system comprising: a generator operably coupled to the power grid; at least one sensor operably coupled between the power grid and the generator; and a controller communicatively coupled to the at least one sensor, the controller comprising at least one processor configured to perform a plurality of operations, the plurality of operations comprising: detecting a fault condition impacting the power generating asset; determining whether the fault condition is occurring in the power generating asset or the power grid, implementing a first response control scheme defining a first current threshold when the fault condition is occurring in the power generating asset and a second response control scheme defining a second current threshold when the fault condition is occurring in the power grid, wherein the first current threshold is less than the second current threshold, and implementing a control action in response to an approach of a current to the first current threshold when the fault condition is occurring in the power generating asset and to the second current threshold when the fault is occurring in the power grid, detecting a continued indication of the fault condition following the implementation of the control action, and tripping a protective feature of the power generating asset.

Clause 15. The system of any preceding clause, wherein the first response control scheme further comprises at least a first control parameter and a first protection parameter, and wherein the second response control scheme further comprises at least a second control parameter and a second protection parameter.

Clause 16. The system of any preceding clause, wherein detecting the fault condition further comprises: detecting a magnitude of the current exceeding a rated current of the power generating asset.

Clause 17. The system of any preceding clause, wherein determining whether the fault condition is occurring in the power generating asset or the power grid further comprises: receiving an indication of at least a first electrical parameter monitored by an operational sensor; calculating at least a second electrical parameter; and based at least on the first and second electrical parameters, determining, via an analysis module of the controller, a fault location of the fault.

Clause 18. The system of any preceding clause, wherein determining the fault location of the fault further comprises: correlating the fault location to a component of an electrical system of the power generating asset.

Clause 19. The system of any preceding clause, wherein the plurality of operations further comprise: implementing a component-response control scheme of a plurality of component-response control schemes of the first response control scheme which corresponds to the component of the electrical system correlating to the fault location.

Clause 20. The system of any preceding clause, wherein each component-response control scheme of the plurality of component response control schemes comprises a corresponding set of control parameters, and wherein implementing the component-response control scheme comprises: modifying at least one control response of the power generating asset based on the corresponding control parameters.

What is claimed is:

1. A method for operating a power generating asset connected to a power grid, the method comprising:
    detecting, via a controller, a fault condition impacting the power generating asset;
    determining, via the controller, whether the fault condition is occurring in the power generating asset or in the power grid;
    implementing a first response control scheme defining a first current threshold when the fault condition is occurring in the power generating asset, and a second response control scheme defining a second current threshold when the fault condition is occurring in the power grid, wherein the first current threshold is less than the second current threshold; and
    implementing a control action in response to an approach of a current to the first current threshold when the fault condition is occurring in the power generating asset and to the second current threshold when the fault condition is occurring in the power grid, wherein the control action comprises at least one of modifying an operating state of the power generating asset, modifying operation of at least one component of the power generating asset, or generating an alarm.

2. The method of claim 1, wherein the first response control scheme further comprises at least a first control parameter and a first protection parameter, and wherein the second response control scheme further comprises at least a second control parameter and a second protection parameter.

3. The method of claim 2, wherein the first and second protection parameters each comprise at least one of a timed overcurrent operating characteristic, an instantaneous-delayed overcurrent operating characteristic, an instantaneous-threshold overcurrent operating characteristic, a definite-time overcurrent operating characteristic, an inverse-time overcurrent operating characteristic, and a hybrid overcurrent operating characteristic.

4. The method of claim 1, wherein detecting the fault condition further comprises:
    detecting, via the controller, a magnitude of the current exceeding a rated current of the power generating asset.

5. The method of claim 4, wherein the current comprises at least one of a grid current, a generator current, a line-converter current, an array current, an energy-storage-device discharge current, and a system-level current.

6. The method of claim 1, wherein determining whether the fault condition is occurring in the power generating asset or in the power grid further comprises:
    receiving, via the controller, an indication of at least a first electrical parameter monitored by an operational sensor;
    calculating, via the controller, at least a second electrical parameter; and
    based at least on the first and second electrical parameters, determining, via an analysis module of the controller, a fault location of the fault.

7. The method of claim 6, wherein the first electrical parameter comprises at least one of a stator voltage, a stator current, a line voltage, and a line current, and wherein the second electrical parameter comprises at least one of calculated indications of a stator power, a stator volt-ampere reactive (VAR), a line power, a line VAR, and a grid-event-ride-through state.

8. The method of claim 6, wherein determining the fault location of the fault further comprises:
correlating, via the controller, the fault location to a component of an electrical system of the power generating asset.

9. The method of claim 8, further comprising:
implementing, via the controller, a component-response control scheme of a plurality of component-response control schemes of the first response control scheme which corresponds to the component of the electrical system correlating to the fault location.

10. The method of claim 9, wherein each component-response control scheme of the plurality of component-response control schemes comprises a corresponding set of control parameters, and wherein implementing the component-response control scheme comprises:
modifying at least one control response of the power generating asset based on the corresponding control parameters.

11. The method of claim 1, further comprising:
detecting, via the controller, a continued indication of the fault condition following the implementation of the control action; and
tripping a protective feature of the power generating asset.

12. The method of claim 11, further comprising:
implementing, via the controller, a delay sequence between the implementation of the control action and the detection of the fault condition following the implementation of the control action.

13. The method of claim 11, wherein the power generating asset comprises one of a wind turbine, a solar power generating asset, a hydroelectric plant, and a hybrid power generating facility.

14. A system for operating a power generating asset connected to a power grid, the system comprising:
a generator operably coupled to the power grid;
at least one sensor operably coupled between the power grid and the generator; and
a controller communicatively coupled to the at least one sensor, the controller comprising at least one processor configured to perform a plurality of operations, the plurality of operations comprising:
detecting a fault condition impacting the power generating asset;
determining whether the fault condition is occurring in the power generating asset or the power grid,
implementing a first response control scheme defining a first current threshold when the fault condition is occurring in the power generating asset and a second response control scheme defining a second current threshold when the fault condition is occurring in the power grid, wherein the first current threshold is less than the second current threshold, and
implementing a control action in response to an approach of a current to the first current threshold when the fault condition is occurring in the power generating asset and to the second current threshold when the fault is occurring in the power grid, wherein the control action comprises at least one of modifying an operating state of the power generating asset, modifying operation of at least one component of the power generating asset, or generating an alarm,
detecting a continued indication of the fault condition following the implementation of the control action, and
tripping a protective feature of the power generating asset.

15. The system of claim 14, wherein the first response control scheme further comprises at least a first control parameter and a first protection parameter, and wherein the second response control scheme further comprises at least a second control parameter and a second protection parameter.

16. The system of claim 14, wherein detecting the fault condition further comprises:
detecting a magnitude of the current exceeding a rated current of the power generating asset.

17. The system of claim 14, wherein determining whether the fault condition is occurring in the power generating asset or the power grid further comprises:
receiving an indication of at least a first electrical parameter monitored by an operational sensor;
calculating at least a second electrical parameter; and
based at least on the first and second electrical parameters, determining, via an analysis module of the controller, a fault location of the fault.

18. The system of claim 17, wherein determining the fault location of the fault further comprises:
correlating the fault location to a component of an electrical system of the power generating asset.

19. The system of claim 18, wherein the plurality of operations further comprise:
implementing a component-response control scheme of a plurality of component-response control schemes of the first response control scheme which corresponds to the component of the electrical system correlating to the fault location.

20. The system of claim 19, wherein each component-response control scheme of the plurality of component response control schemes comprises a corresponding set of control parameters, and wherein implementing the component-response control scheme comprises:
modifying at least one control response of the power generating asset based on the corresponding control parameters.

* * * * *